US010522093B2

(12) United States Patent
Chen et al.

(10) Patent No.: US 10,522,093 B2
(45) Date of Patent: Dec. 31, 2019

(54) DRIVING CIRCUIT AND DISPLAY PANEL

(71) Applicant: Au Optronics Corporation, Hsinchu (TW)

(72) Inventors: Hsiao-Chun Chen, Hsinchu (TW); Er-Lang Deng, Taichung (TW); Wei-Kai Huang, Hsinchu County (TW); Yi-Fu Chen, Kaohsiung (TW); Cheng-Hung Ko, New Taipei (TW); Chia-Heng Chen, Kaohsiung (TW); Shin-Shian Lee, Hsinchu (TW); You-Ying Lin, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 41 days.

(21) Appl. No.: 15/910,026

(22) Filed: Mar. 2, 2018

(65) Prior Publication Data

US 2018/0336847 A1 Nov. 22, 2018

(30) Foreign Application Priority Data

May 19, 2017 (TW) .............................. 106116693 A

(51) Int. Cl.
*G02F 1/133* (2006.01)
*G09G 3/34* (2006.01)
*G02F 1/1362* (2006.01)

(52) U.S. Cl.
CPC ........ *G09G 3/3406* (2013.01); *G02F 1/13306* (2013.01); *G02F 1/136286* (2013.01); *G09G 2310/0264* (2013.01)

(58) Field of Classification Search
CPC ........... G02F 1/13306; G02F 1/136286; G02F 1/1368; G09G 2310/0264; G09G 3/3406;
(Continued)

(56) References Cited

U.S. PATENT DOCUMENTS 6,529,258 B2    3/2003  Watanabe et al.
2002/0044120 A1  4/2002  Watanabe et al.
(Continued)

FOREIGN PATENT DOCUMENTS

JP   2002099225   4/2002
TW   I226944     1/2005
TW   I406033     8/2013

*Primary Examiner* — Richard J Hong
(74) *Attorney, Agent, or Firm* — JCIPRNET

(57) ABSTRACT

A driving circuit including an output circuit, a pull-down module, conductive wires, at least one first signal line, and a buffer layer is provided. The conductive wires are electrically connected between the output circuit and the pull-down module. The output circuit and the pull-down module are electrically coupled to a driving control signal through the first signal line. A first overlapping region is located between the first signal line and a portion of the conductive wires. The buffer layer is disposed between the first signal line and the portion of the conductive wires. The buffer layer includes an overlapping portion and an extending portion. The overlapping portion is at least disposed in the first overlapping region. The extending portion is disposed outside the overlapping portion. A thickness of the overlapping portion is greater than a thickness of the extending portion. A display panel is also provided.

21 Claims, 11 Drawing Sheets

(58) Field of Classification Search
CPC .... G09G 3/20; G11C 19/28; H03K 19/00384; H01L 27/12
See application file for complete search history.

(56) References Cited

U.S. PATENT DOCUMENTS

| | | | |
|---|---|---|---|
| 2005/0236615 A1* | 10/2005 | Itoh | H01L 27/12 257/40 |
| 2013/0048999 A1* | 2/2013 | Okazaki | G02F 1/1368 257/59 |
| 2015/0049853 A1* | 2/2015 | Lin | G11C 19/28 377/64 |
| 2015/0255014 A1* | 9/2015 | Lin | G11C 19/28 345/84 |
| 2015/0288364 A1* | 10/2015 | Lin | H03K 19/00384 377/75 |
| 2016/0019828 A1* | 1/2016 | Lin | G09G 3/20 345/214 |

* cited by examiner

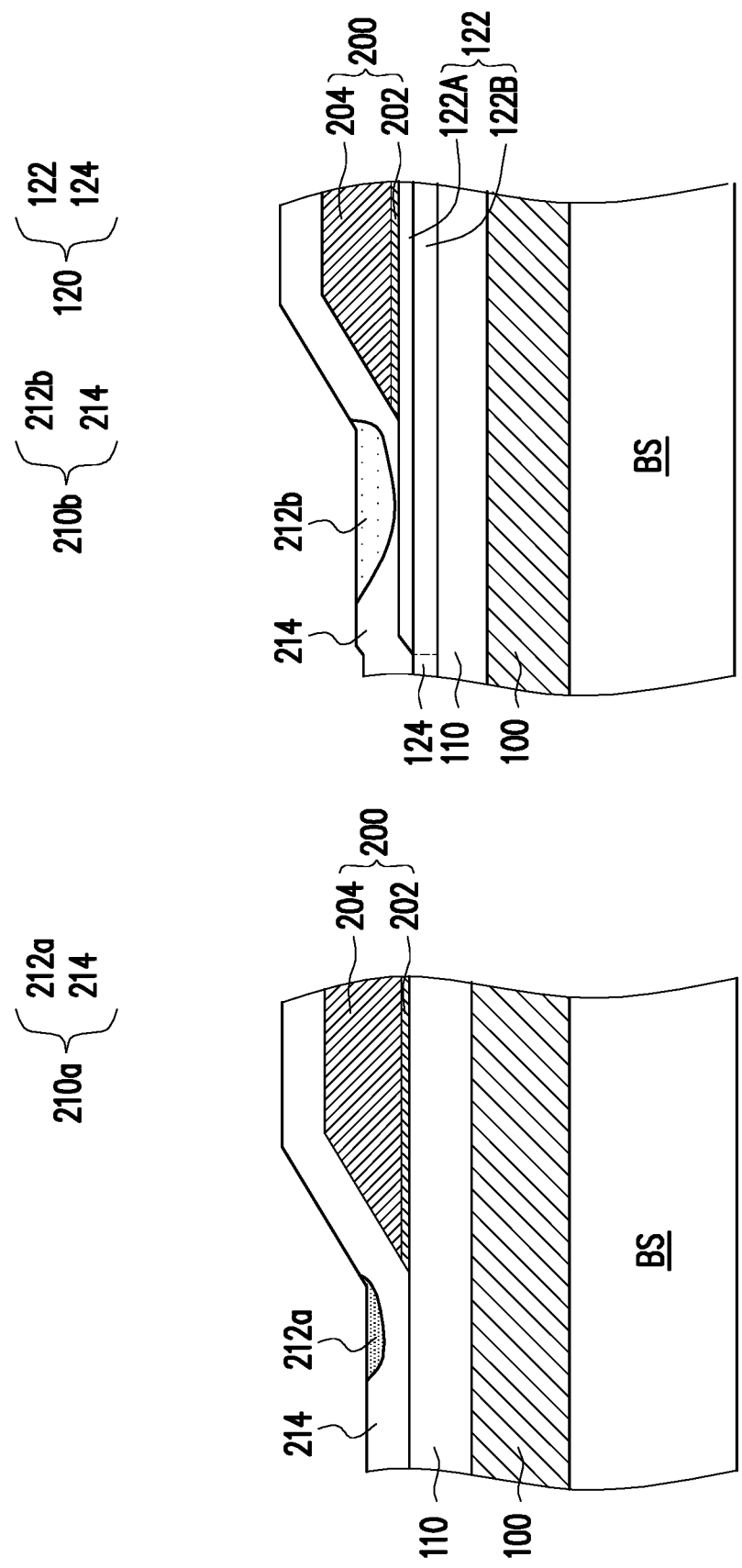

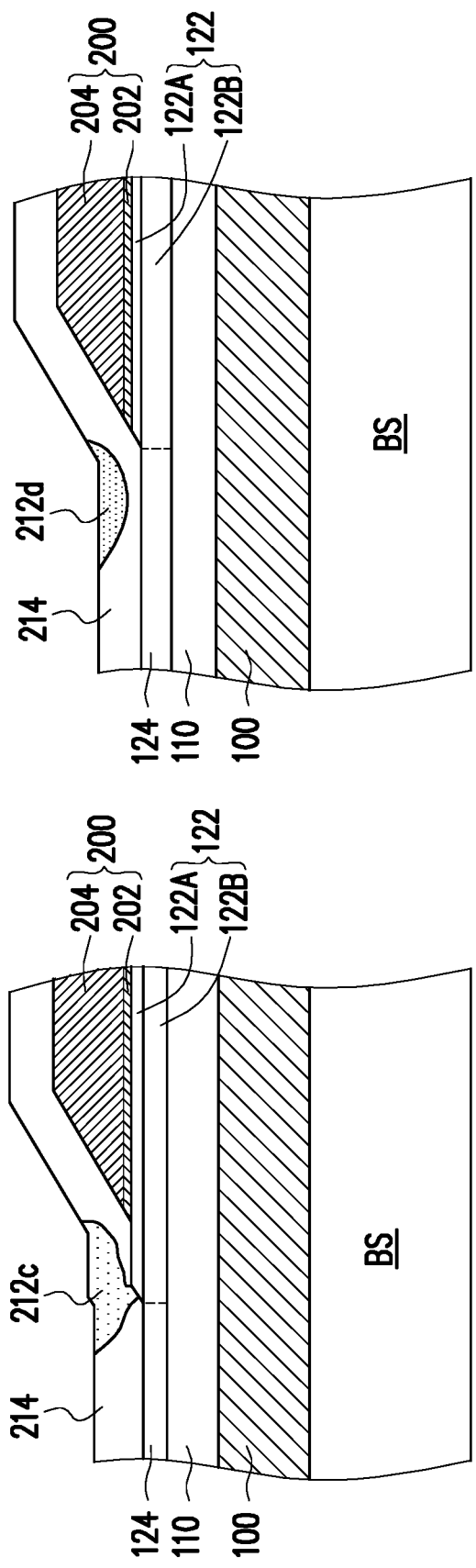

DRIVING CIRCUIT AND DISPLAY PANEL

CROSS-REFERENCE TO RELATED APPLICATION

This application claims the priority benefit of Taiwan application serial no. 106116693, filed on May 19, 2017. The entirety of the above-mentioned patent application is hereby incorporated by reference herein and made a part of this specification.

BACKGROUND OF THE INVENTION

Field of the Invention

The invention relates to a driving circuit and a display panel and more particularly relates to a driving circuit having a buffer layer and a display panel.

Description of Related Art

Existing gate-driver-on-array (GOA) display panels are mostly comprised of thin film transistors (TFT). In the existing gate driving circuits, a portion of the signal line located at the first layer and a portion of the signal line located at the second layer are interlaced. During the etching process (such as an etch-back process), defects are more likely to occur on the corners of the signal line located at the second layer. As a result, in the subsequent process for forming a protective layer, the stress is concentrated on the protective layer around the defects, which further creates defects on the film layers of the protective layer.

Due to the defects on the protective layer, etching solutions later applied in the process may etch an insulation layer located between the signal lines in the two layers through the defects. As such, leakage of current and short circuits occur between the signal lines in the two layers, which leads to the output malfunction of the driving circuits. Therefore, methods for solving such a problem is needed.

SUMMARY OF THE INVENTION

The invention provides a driving circuit capable of correcting signal malfunction caused by current leakage of conductive wires and signal lines.

The invention provides a display panel capable of correcting signal malfunction caused by current leakage of conductive wires and signal lines.

In an embodiment of the invention, a driving circuit including an output circuit, a pull-down module, a plurality of conductive wires, at least one first signal line, and a buffer layer is provided. The conductive wires are electrically connected between the output circuit and the pull-down module. The at least one first signal line is configured to couple the output circuit and the pull-down module to a driving control signal, wherein a first overlapping region exists between the at least one first signal line and a portion of the conductive wires. The buffer layer is disposed between the at least one first signal line and a portion of the conductive wires. The buffer layer includes an overlapping portion and an extending portion. The overlapping portion is at least located in the first overlapping region, and the extending portion is located outside of the overlapping portion. A thickness of the overlapping portion is greater than a thickness of the extending portion.

In an embodiment of the invention, a display panel including a pixel region and a driving circuit region located on at least one side of the pixel region is provided. The display panel includes a pixel array and a gate driving circuit. The pixel array is located in the pixel region. The pixel array includes a plurality of data lines, a plurality of scan lines, and a plurality of pixel structures electrically connected to the scan lines and the data lines. The gate driving circuit is located in the driving circuit region and electrically connected to the pixel array. The gate driving circuit includes an output circuit, a pull-down module, a plurality of conductive wires, at least one first signal line, and a buffer layer. An end of the output circuit is connected to the pixel array. The conductive wires are connected between the output circuit and the pull-down module. The at least one first signal line is configured to couple the output circuit and the pull-down module to a driving control signal. A first overlapping region exists between the at least one first signal line and a portion of the conductive wires. The buffer layer is disposed between the at least one first signal line and a portion of the conductive wires. The buffer layer includes an overlapping portion and an extending portion. The overlapping portion is at least located in the first overlapping region, and the extending portion is located outside of the overlapping portion. A thickness of the overlapping portion is greater than a thickness of the extending portion.

Based on the above, in the driving circuit of the invention, the at least one first signal line is coupled to the driving control signal, and the buffer layer is disposed between the at least one first signal line and the conductive wires. The design of the buffer layer is able to disperse the stress, so as to avoid current leakage between the at least one first signal line and the conductive wires in the driving circuit.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 7 is a schematic cross-sectional view of a portion of circuit layout of a driving circuit in a comparative example of the invention.

FIG. 8 is a schematic cross-sectional view of a portion of circuit layout of a driving circuit in an embodiment of the invention.

FIG. 9 is a schematic cross-sectional view of a portion of circuit layout of a driving circuit in an embodiment of the invention.

FIG. 10 is a schematic cross-sectional view of a portion of circuit layout of a driving circuit in an embodiment of the invention.

DESCRIPTION OF THE EMBODIMENTS

To elaborate the invention, a driving circuit applied in a display panel is taken as an example in the following embodiments. Nevertheless, the driving circuit provided in the invention is not limited to being applied in display panels but may be applied as a driving circuit of other electronic devices.

Figure 12:
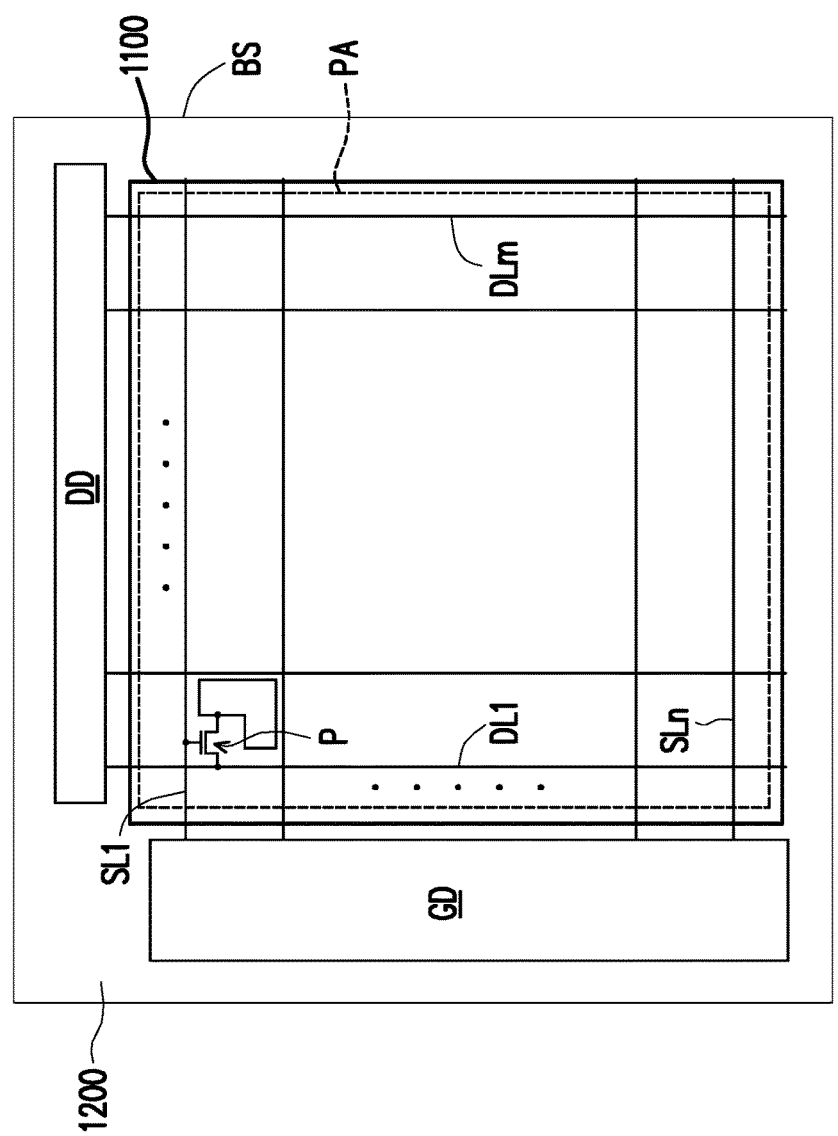
FIG. 12 is a schematic top view of a display panel in an embodiment of the invention.

In general, a display panel 1000 includes a pixel region 1100 and a driving circuit region 1200 located on at least one side of the pixel region 1100, as shown in FIG. 12. The driving circuit region 1200 is usually located on a substrate BS in an exemplary liquid crystal display (LCD) panel. More specifically, a display panel includes a pixel array PA and a driving circuit. In this embodiment, the driving circuit includes a gate driving circuit GD and a source driving circuit DD. The pixel array PA is located in the pixel region 1100, while the driving circuit is located in the driving circuit region 1200.

The pixel array PA includes a plurality of scan lines SL1-SLn, a plurality of data lines DL1-DLm, and a plurality of pixel structures P electrically connected to the scan lines SL1-SLn and the data lines DL1-DLm. The gate driving circuit GD and the source driving circuit DD are located in the driving circuit region 1200 and are electrically connected to the pixel array PA. The aforementioned pixel structures P may be pixel structures of any known display panels. The gate driving circuit GD is taken as an example in the following embodiment of the invention, whereas the source driving circuit DD may also be applicable in the invention.

Figure 1:
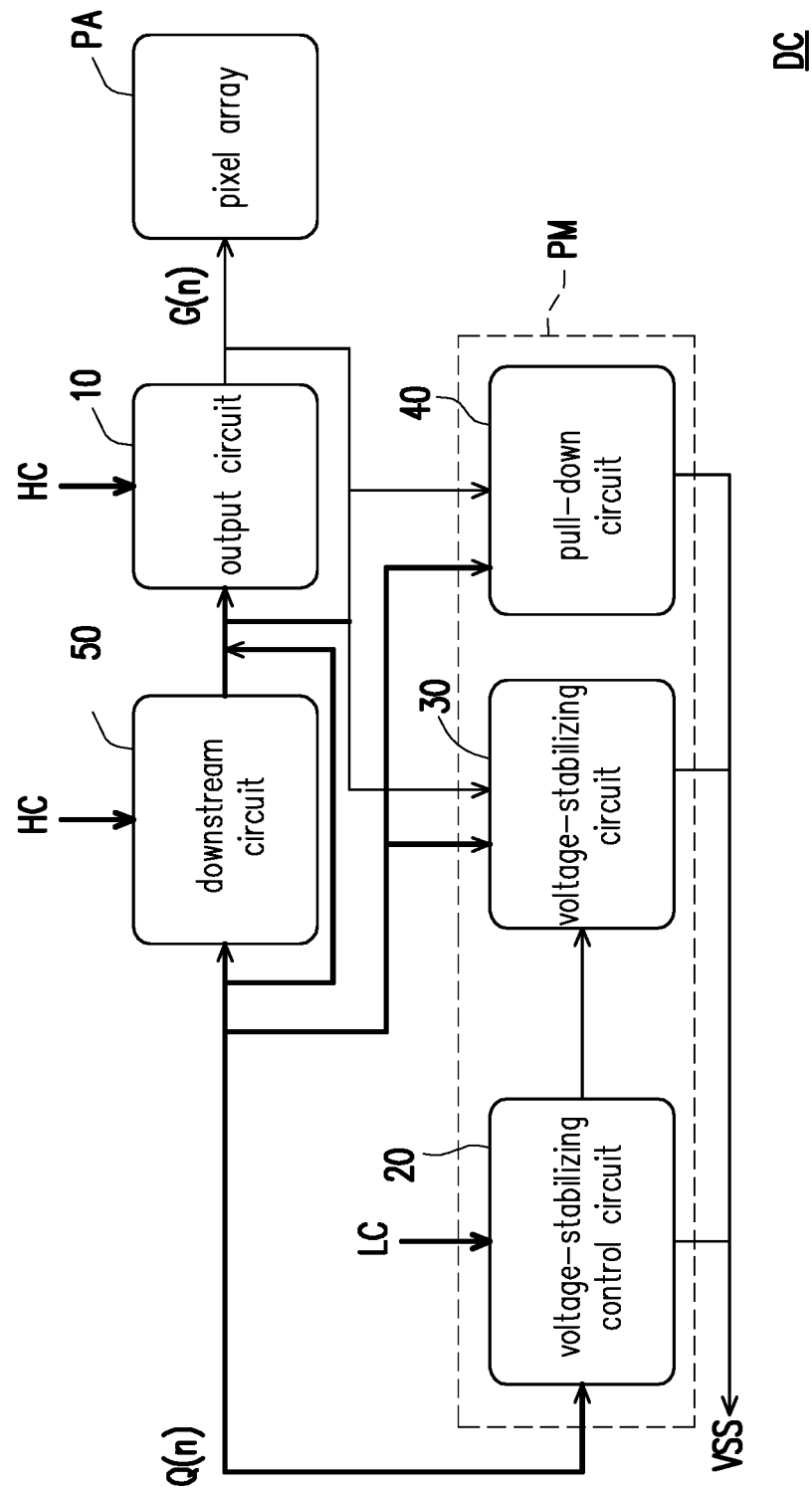
FIG. 1 is a schematic diagram of a driving circuit in an embodiment of the invention.
Figure 2:
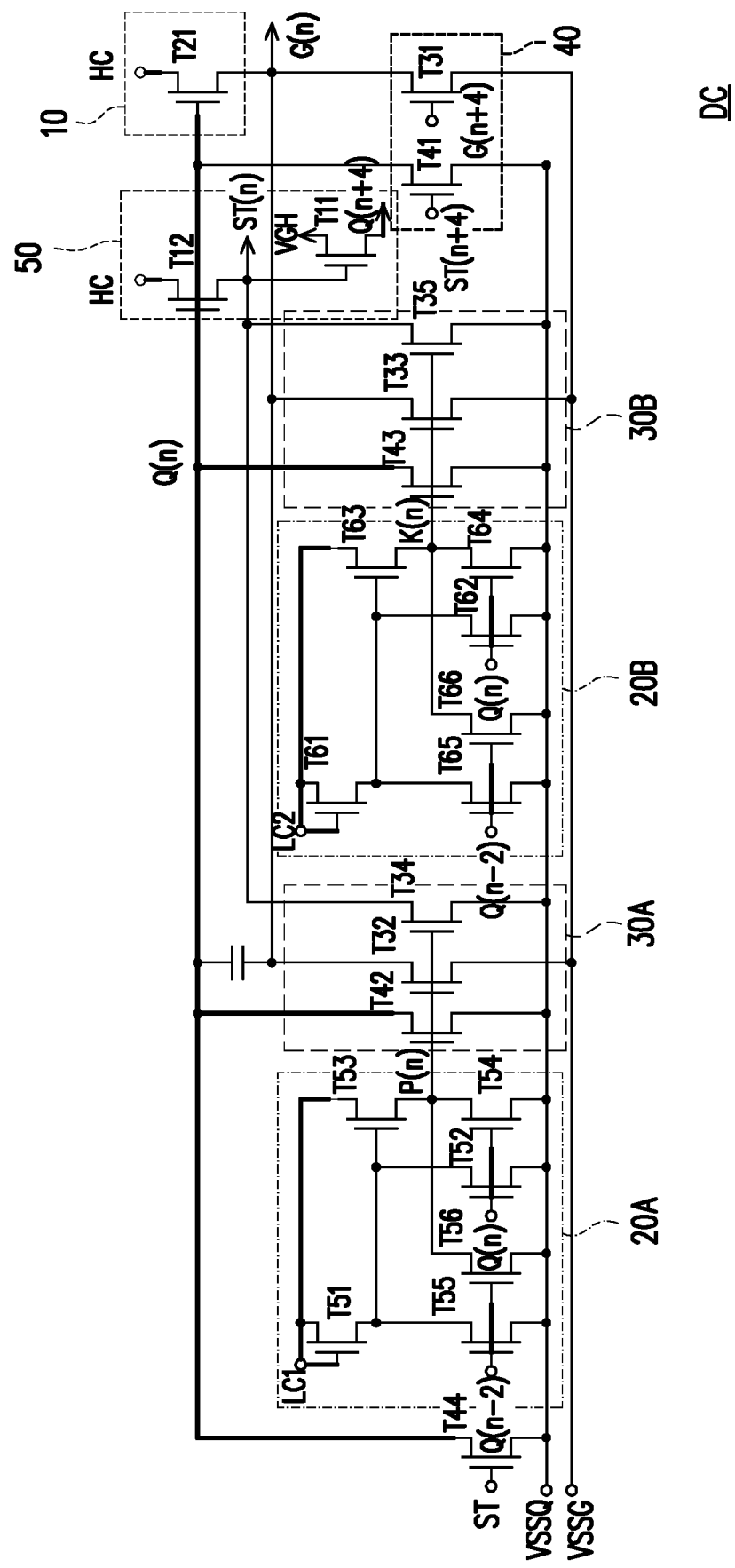
FIG. 2 is a schematic equivalent circuit diagram of a driving circuit in an embodiment of the invention.

Referring to FIG. 1 and FIG. 2, FIG. 1 is a schematic diagram of a driving circuit in an embodiment of the invention, while FIG. 2 is a schematic equivalent circuit diagram of a driving circuit in an embodiment of the invention. Referring to FIG. 1, in an embodiment, a driving circuit DC includes an output circuit 10 and a pull-down module PM coupled to the output circuit 10. The output circuit 10 and the pull-down module PM are coupled to a driving control signal Q(n) through a first signal line. The first signal line is configured to, for example, transmit the driving control signal Q(n). A second signal line is configured to transmit a clock signal HC to the output circuit 10.

In this embodiment, the pull-down module PM includes a voltage-stabilizing control circuit 20, a voltage-stabilizing circuit 30, and a pull-down circuit 40. The output circuit 10 is, for example, electrically connected to the voltage-stabilizing circuit 30 and the pull-down circuit 40 though conductive wires. The output circuit 10 is electrically connected to a pixel array PA though an output signal line. Here, the pixel array PA is located in the pixel region 1100, as shown in FIG. 12. In an embodiment, the output circuit 10 transmits a driving signal G(n) to the output signal line based on the driving control signal Q(n). The output circuit 10 is electrically connected to the pixel array PA in the pixel region 1100 through the output signal line.

In an embodiment, the driving circuit DC further includes a downstream circuit 50. The downstream circuit 50 is coupled to the driving control signal Q(n) through the at least one first signal line and is electrically connected to the output circuit 10.

In this embodiment, the driving circuit DC is, for example, a gate driving circuit. That is to say, the gate driving circuit GD includes an output circuit 10, a pull-down module PM, a plurality of conductive wires, and at least one first signal line. The output circuit 10 of the gate driving circuit GD transmits the driving signal G(n) to the output signal line based on the driving control signal Q(n). The output circuit 10 is electrically connected to the scan line SLn in the pixel array PA through the output signal line.

Please refer to FIG. 2. FIG. 2 is a schematic equivalent circuit diagram in an embodiment of FIG. 1; however, the invention is not limited thereto. In an embodiment, the output circuit 10 of the driving circuit DC includes a thin film transistor T21. The thin film transistor T21 includes a gate, a source, and a drain. A first end (e.g., the gate) of the thin film transistor T21 is connected to the at least one first signal line and receives the driving control signal Q(n). In this embodiment, the driving control signal Q(n) is, for example, a high-voltage signal. A second end (e.g., the source) of the thin film transistor T21 is connected to the second signal line and receives the clock signal HC. A third end (e.g., the drain) of the thin film transistor T21 is connected to the output signal line and outputs the driving signal G(n).

Referring to FIG. 1, in an embodiment, the downstream circuit 50 of the driving circuit DC is, for example, electrically connected to the output circuit 10, the voltage-stabilizing control circuit 20, the voltage-stabilizing circuit 30, and the pull-down circuit 40 through the at least one first signal line and/or the conductive wires. The second signal line transmits the clock signal HC to the downstream circuit 50.

Referring to FIG. 2, in an embodiment, the downstream circuit 50 of the driving circuit DC includes a thin film transistor T11 and a thin film transistor T12. A first end of the thin film transistor T11 is electrically connected to the thin film transistor T12 through the conductive wires. A second end of the thin film transistor T11 is electrically connected to a voltage VGH. A third end of the thin film transistor T11 is electrically connected to a first signal line configured to transmit a control signal Q(n+4). A first end of the thin film transistor T12 is electrically connected to a first signal line configured to transmit the driving control signal Q(n). A second end of the thin film transistor T12 is electrically connected to a second signal line configured to transmit the clock signal HC. A third end of the thin film transistor T12 is electrically connected to a start signal ST(n) and the first end of the thin film transistor T11.

Referring to FIG. 1, the voltage-stabilizing control circuit 20 of the driving circuit DC is, for example, electrically connected to the voltage-stabilizing circuit 30 through the conductive wires. A third signal line transmits a clock signal LC to the voltage-stabilizing control circuit 20. The voltage-stabilizing control circuit 20, the voltage-stabilizing circuit 30, and the pull-down circuit 40 are electrically connected to a stationary voltage VSS through the conductive wires.

Referring to FIG. 2, in an embodiment, the driving circuit DC includes a voltage-stabilizing control circuit 20A, a voltage-stabilizing control circuit 20B, a voltage-stabilizing circuit 30A, a voltage-stabilizing circuit 30B, and a pull-down circuit 40.

The voltage-stabilizing control circuit 20A includes thin film transistors T51 to T56. A first end of the thin film transistor T51, a second end of the thin film transistor T51, and a second end of the thin film transistor T53 are electrically connected to a third signal line that transmits a clock signal LC1. A third end of the thin film transistor T51 is electrically connected to a second end of the thin film transistor T52, a first end of the thin film transistor T53, and a second end of the thin film transistor T55 through the conductive wires. A first end of the thin film transistor T52 and a first end of the thin film transistor T54 are electrically connected to the first signal line configured to transmit the driving control signal Q(n). A first end of the thin film transistor T55 and a first end of the thin film transistor T56 are electrically connected to the first signal line configured to transmit a control signal Q(n−2). A third end of the thin film transistor T53, a second end of the thin film transistor T54, and a second end of the thin film transistor T56 are electrically connected to a signal P(n) and the voltage-stabilizing circuit 30A through the conductive wires. Third ends of the thin film transistors T52, T54, T55, and T56 are electrically connected to a stationary voltage VSSQ through the conductive wires.

The voltage-stabilizing circuit 30A includes a thin film transistor T42, a thin film transistor T32, and a thin film transistor T34. First ends of the thin film transistors T42, T32, and T34 are electrically connected to the signal P(n) and the voltage-stabilizing control circuit 20A through the conductive wires. A second end of the thin film transistor T42 is electrically connected to the first signal line configured to transmit the driving control signal Q(n). A second end of the thin film transistor T32 is electrically connected to the voltage-stabilizing circuit 30B and the output signal line. A second end of the thin film transistor T34 is electrically connected to the voltage-stabilizing circuit 30B and the downstream circuit 50 through the conductive wires. Third ends of the thin film transistors T42 and T34 are electrically connected to the stationary voltage VSSQ through the conductive wires. A third end of the thin film transistor T32 is electrically connected to a stationary voltage VSSG through the conductive wires.

The voltage-stabilizing control circuit 20B includes thin film transistors T61 to T66. A first end of the thin film transistor T61, a second end of the thin film transistor T61, and a second end of the thin film transistor T63 are electrically connected to a third signal line that transmits a clock signal LC2. A third end of the thin film transistor T61 is electrically connected to a second of the thin film transistor T62, a first end of the thin film transistor T63, and a second end of the thin film transistor T65 through the conductive wires. A first end of the thin film transistor T62 and a first end of the thin film transistor T64 are electrically connected to a first signal line configured to transmit the driving control signal Q(n). A first end of the thin film transistor T65 and a first end of the thin film transistor T66 are electrically connected to the first signal line configured to transmit the control signal Q(n−2). A third end of the thin film transistor T63, a second end of the thin film transistor T64, and a second end of the thin film transistor T66 are electrically connected to a signal K(n) and the voltage-stabilizing circuit 30B through the conductive wires. Third ends of the thin film transistors T62, T64, T65, and T66 are electrically connected to the stationary voltage VSSQ through the conductive wires.

In an embodiment, the clock signal LC2 transmitted to the voltage-stabilizing control circuit 20B and the clock signal LC1 transmitted to the voltage-stabilizing control circuit 20A are reverse signals.

The voltage-stabilizing circuit 30B includes a thin film transistor T43, a thin film transistor T33, and a thin film transistor T35. First ends of the thin film transistors T43, T33, and T35 are electrically connected to the signal K(n) and the voltage-stabilizing control circuit 20B through the conductive wires. A second end of the thin film transistor T43 is electrically connected to a first signal line configured to transmit the driving control signal Q(n). A second end of the thin film transistor T33 is electrically connected to the voltage-stabilizing circuit 30A and the output signal line. A second end of the thin film transistor T35 is electrically connected to the voltage-stabilizing circuit 30A and the downstream circuit 50 through the conductive wires. Third ends of the thin film transistors T43 and T35 are electrically connected to the stationary voltage VSSQ through the conductive wires. A third end of the thin film transistor T33 is electrically connected to the stationary voltage VSSG through the conductive wires.

The pull-down circuit 40 includes a thin film transistor T31 and a thin film transistor T41. A first end of the thin film transistor T31 is, for example, electrically connected to the next-four-stage driving signal G(n+4). A second end of the thin film transistor T31 is electrically connected to the output circuit 10 and the driving signal G(n) through the conductive wires. A third end of the thin film transistor T31 is electrically connected to the stationary voltage VSSG through the conductive wires. A first end of the thin film transistor T41 is electrically connected to a signal ST(n+4). A second end of the thin film transistor T41 is electrically connected to the output circuit 10 and the downstream circuit 50 through the conductive wires. A third end of the thin film transistor T41 is electrically connected to the stationary voltage VSSQ through the conductive wires.

In an embodiment, the driving circuit DC further includes a thin film transistor T44. A first end of the thin film transistor T44 is electrically connected to a signal ST. A second end of the thin film transistor T44 is electrically connected to the first signal line configured to transmit the driving control signal Q(n). A third end of the thin film transistor T44 is electrically connected to the stationary voltage VSSQ through the conductive wires.

Figure 3A:
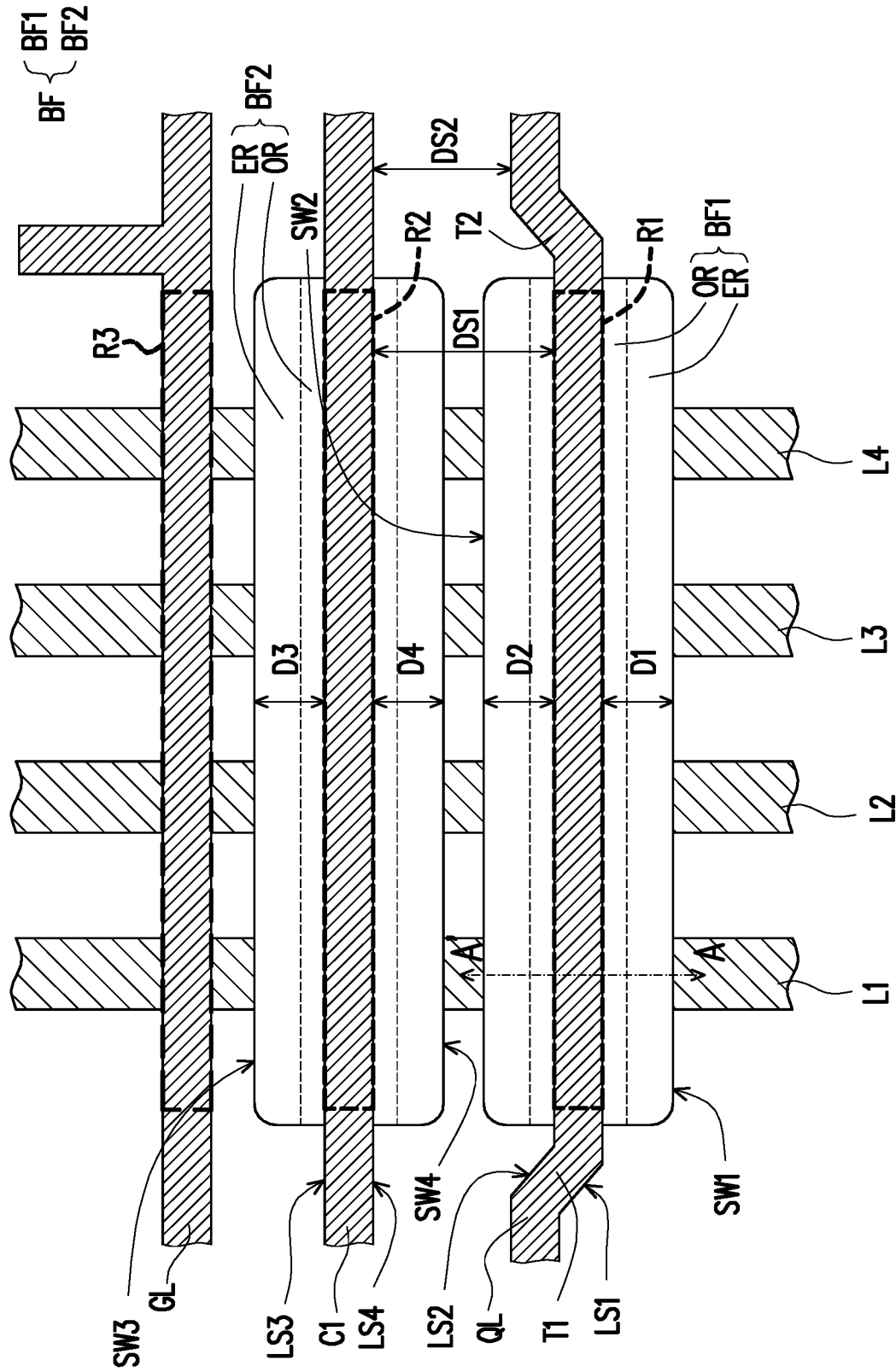
FIG. 3A is a schematic diagram of a portion of circuit layout of a driving circuit in an embodiment of the invention.
Figure 3B:
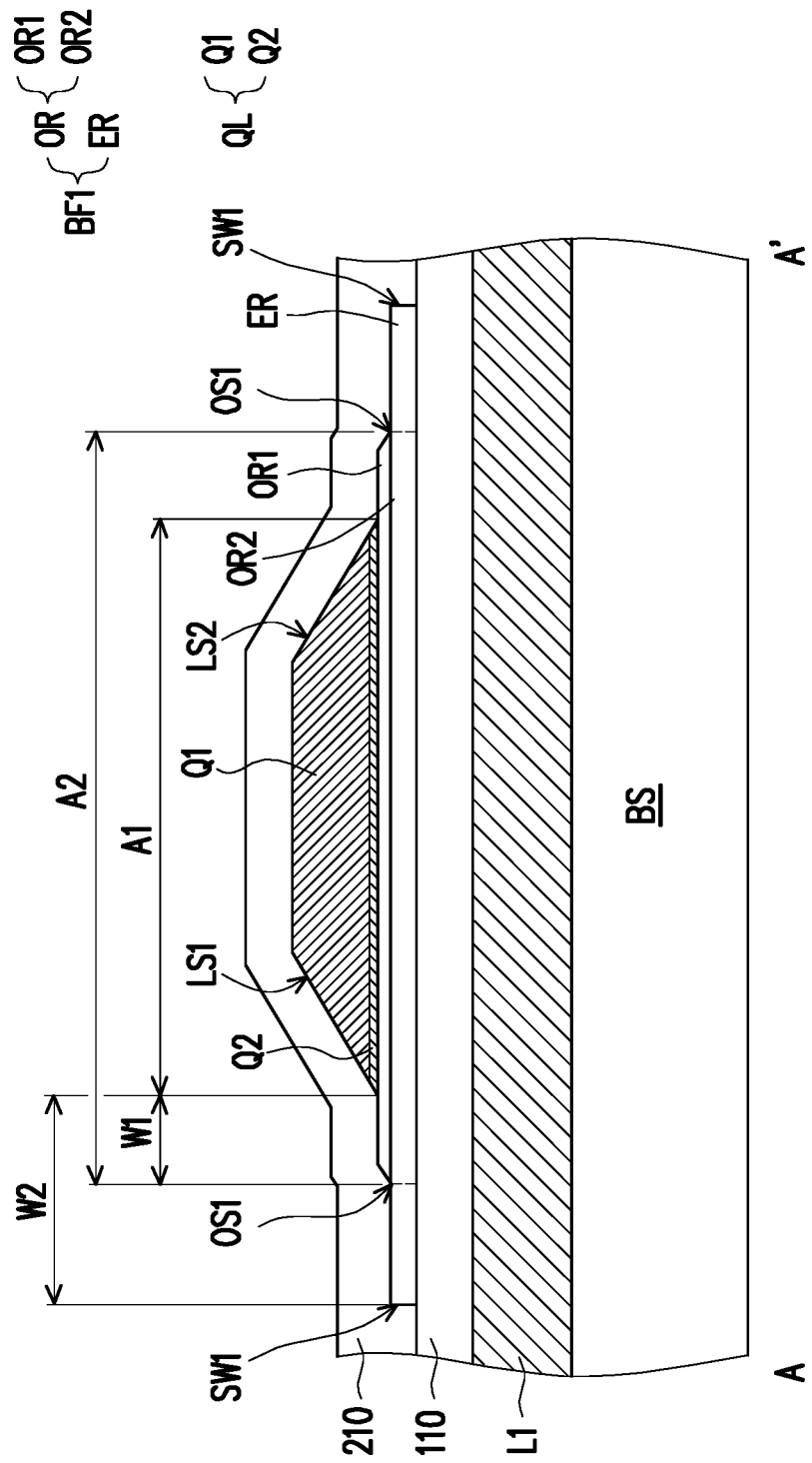
FIG. 3B is a schematic cross-sectional view along a sectional line AA' in FIG. 3A.

FIG. 3A schematically depicts a portion of a circuit layout of a driving circuit in an embodiment of the invention (for instance, a portion of a circuit layout of the driving circuit in FIG. 2). FIG. 3B is a schematic cross-sectional view along a sectional line AA' in FIG. 3A. Referring to FIG. 3A and FIG. 3B together, conductive wires L1 to L4 are located on a substrate BS. An output signal line GL, a first signal line QL, a second signal line C1, and a third signal line (not depicted) are located on the conductive wires L1 to L4. An insulation layer 110 is interposed between the conductive wires L1 to L4 and the output signal line GL, the first signal line QL, the second signal line C1, and the third signal line. The conductive wires L1 to L4 and the output signal line GL, the first signal line QL, the second signal line C1, and the third signal line (not depicted) belong to different metal layers. In an embodiment, the first signal line QL includes a top layer Q1 and a bottom layer Q2 located between the top layer Q1 and the insulation layer 110. In an embodiment, a material of the top layer Q1 of the first signal line QL includes copper, for instance, while a material of the bottom layer Q2 of the first signal line QL includes molybdenum, for instance. In an embodiment, a thickness of the top layer Q1 of the first signal line QL is greater than a thickness of the bottom layer Q2 of the first signal layer QL. In an embodiment, a side of the top layer Q1 of the first signal line QL may be aligned to a side of the bottom layer Q2 of the first signal layer QL. Nevertheless, the invention is not limited to the above. In other embodiments, the side of the bottom layer Q2 of the first signal line QL may shrink within the side of the top layer Q1 of the first signal line QL. In an embodiment, a width of the bottom layer Q2 of the first signal line QL on an orthogonal projection surface is smaller than a width of the top layer Q1 of the first signal line QL on an orthogonal projection surface. Nevertheless, the invention is not limited to the above. In an embodiment, the output signal line GL, the first signal line QL, the second signal line C1, and the third signal line (not depicted) may be made of the same material and composed of the same stacked layers. In an embodiment, the first signal line QL is, for example, configured to transmit a driving control signal (such as a driving control signal Q(n)). In an embodiment, the second signal line C1 is, for example, configured to transmit a clock signal (such as a clock signal HC). In an embodiment, the output signal GL is, for example, configured to transmit a driving signal (such as a driving signal G(n)). In an embodiment, the output signal line GL is, for example, a gate signal line, and the output signal line is electrically connected to a scan line SLn in a pixel array PA. Although only four conductive wires and three signal lines are depicted in FIG. 3A, the invention is not limited thereto. In an embodiment, three signal lines may be interlaced with one conductive wire. In another embodiment, one signal line may be interlaced with more than one conductive wire. Moreover, although the three signal lines are depicted to be located on the four conductive wires in FIG. 3A, the invention is not limited thereto. In an embodiment, a signal line may be located under four conductive wires, and an insulation layer may be interposed between the signal line and the four conductive wires. Another two conductive wires may be located on the four conductive wires, and another insulation layer is interposed between the two conductive wires and the four conductive wires.

An overlapping region R1 exists between the first signal line QL and the conductive wires L1 to L4. More specifically, the first signal line QL and the conductive wires L1 to L4 are interlaced to form the overlapping region R1. A first part BF1 of a buffer layer BF is located between the first signal line QL and the conductive wires L1 to L4. In an embodiment, the first part BF1 of the buffer layer BF is located between the first signal line QL and the insulation layer 110.

In an embodiment, the first part BF1 of the buffer layer BF includes an overlapping portion OR and an extending portion ER. The overlapping region OR is at least located in the overlapping region R1, and the extending portion ER is located outside of the overlapping portion OR. In an embodiment, the extending portion ER is located on two sides of the overlapping portion OR. Nevertheless, the invention is not limited to the above. In other embodiments, the extending portion ER is located around the overlapping portion OR. A thickness of the overlapping portion OR is greater than a thickness of the extending portion ER. In some preferred embodiments, the overlapping portion OR of the first part BF1 of the buffer layer BF exceeds the overlapping region R1 of the first signal line QL and the conductive lines L1 to L4 on an orthogonal projection surface. A material of the buffer layer BF includes, for example, silicon (such as amorphous silicon, polysilicon, monocrystalline silicon, and doped amorphous silicon stacked layers), an insulation material (such as germanium nitride (GeNx)), or other appropriate materials. In an embodiment, the overlapping portion OR has, for example, a double-layered structure. The overlapping portion OR includes a doped portion OR1 and an amorphous portion OR2. In an embodiment, a material of the doped portion OR1 includes doped amorphous silicon (such as N-type doping). Materials of the extending portion ER and the amorphous portion OR2 include undoped amorphous silicon. Although it is only depicted in this embodiment that the first part BF1 of the buffer layer BF includes the overlapping portion OR and the extending portion ER, the invention is not limited thereto. In some embodiments, other parts of the buffer layer BF also include the overlapping portion OR and the extending portion ER.

In an embodiment, the first signal line QL has a first long side LS1 and a second long side LS2. The first part BF1 of the buffer layer BF has a first edge SW1 and a second edge SW2. The first edge SW1 extends along an extending direction of the first long side LS1. A first distance D1 is between the first edge SW1 and the first long side LS1 on an orthogonal projection surface. The orthogonal projection surface here refers to an orthogonal projection on an upper surface of the substrate BS. The second edge SW2 extends along an extending direction of the second long side LS2. A second distance D2 is between the second edge SW2 and the second long side LS2 on an orthogonal projection surface. In this embodiment, D1=D2. According to this embodiment, the first edge SW1 is parallel to the first long side LS1, and the second edge SW2 is parallel to the second long side LS2.

In an embodiment, a width of an orthogonal projection of the first signal line QL on a surface of the substrate BS is A1, while a width of an orthogonal projection of the overlapping portion OR on a surface of the substrate BS is A2. A ratio of A1/A2 falls, for example, in a range from 0.05 to 1. In an embodiment, A1/A2 falls, for example, in a range from 0.7 to 0.9.

In an embodiment, the overlapping portion OR has a first border OS1 and a second border OS2. The first border OS1 falls between the first edge SW1 and the first long side LS1 on an orthogonal projection surface. The second border OS2 falls between the second edge SW2 and the second long side LS2 on an orthogonal projection surface. In an embodiment, the first border OS1 extends along an extending direction of the first edge SW1 on an orthogonal projection surface and is, for example, parallel to the first edge SW1. The second border OS2 extends along an extending direction of the second edge SW2 on an orthogonal projection surface and is, for example, parallel to the second edge SW2.

In an embodiment, the overlapping portion OR has a width W1 that exceeds the first long side LS1 of the first signal line QL on an orthogonal projection surface. That is to say, the width W1 is a distance between the first border OS1 and the first long side LS1 on the orthogonal projection surface. The extending portion ER has a second width W2 that exceeds the first long side LS2 of the first signal line QL. That is to say, the width W2 is a distance between the first edge SW1 and the first long side LS1 on the orthogonal projection surface. In an embodiment, W1/W2 falls, for example, in a range from 0.01 to 0.99. In another embodiment, W1/W2 falls, for example, in a range from 0.05 to 0.5. In an embodiment, a width of the overlapping portion OR exceeding the first long side LS1 of the first signal line QL on the orthogonal projection surface equals a width of the overlapping portion OR exceeding the second long side LS2 of the first signal line QL on the orthogonal projection surface. In an embodiment, a width of the extending portion ER exceeding the first long side LS1 of the first signal line QL on the orthogonal projection surface equals a width of the extending portion ER exceeding the second long side LS2 of the first signal line QL on the orthogonal projection surface.

An overlapping region R2 exists between the second signal line C1 and the conductive wires L1 to L4. More specifically, the second signal line C1 and the conductive lines L1 to L4 are interlaced with each other to form the overlapping region R2. A second part BF2 of the buffer layer BF is further disposed between the second signal line C1 and the conductive wires L1 to L4 and is at least located in the overlapping region R2. In some preferred embodiments, an overlapping portion OR of the second part BF2 of the buffer layer BF exceeds the overlapping region R2 of the second signal line C1 and the conductive wires L1 to L4 on an orthogonal projection surface.

In an embodiment, the second signal line C1 has a first long side LS3 and a second long side LS4. The second part BF2 of the buffer layer BF has a first edge SW3 and the second edge SW4. The first edge SW3 extends along an extending direction of the first long side LS3. A first distance D3 is between the first edge SW3 and the first long side LS3 on an orthogonal projection surface. The orthogonal projection surface is, for example, a surface of the substrate BS facing the second signal line C1. The second edge SW4 extends along an extending direction of the second long side LS4. A second distance D4 is between the second edge SW4 and the second long side LS4 on an orthogonal projection surface. In this embodiment, D3=D4. According to the embodiment, the first edge SW3 is parallel to the first long side LS3, and the second edge SW4 is parallel to the second long side LS4.

In this embodiment, the second part BF2 of the buffer layer BF overlaps the second signal line C1 in a manner similar to the manner in which the first part BF1 of the buffer layer BF overlaps the first signal line QL. Nevertheless, the invention is not limited thereto. In other embodiments, the second part BF2 of the buffer layer BF overlaps the second signal line C1 in a manner different from the manner in which the first part BF1 of the buffer layer BF overlaps the first signal line QL.

The buffer layer BF located in different overlapping regions is not connected or overlapped. For example, the first part BF1 of the buffer layer BF is separated from the second part BF2 of the buffer layer BF. Thereby, the first part BF1 and the second part BF2 are not conductive.

In an embodiment, each of the thin film transistors in the driving circuit includes a semiconductor channel layer. The buffer layer BF is separated from the semiconductor channel layer of the each of the thin film transistors. Thereby, the buffer layer BF does not influence signals generated by the thin film transistors. In an embodiment, the buffer layer BF and the semiconductor channel layers of the thin film transistors in the driving circuit belong to the same film layer.

In this embodiment, the first signal line QL is located adjacent to the second signal line C1. The first signal line QL has a first transition portion T1 and a second transition portion T2 which correspond to the overlapping region R2. Therefore, a first gap DS1 located between the second signal line C1 and the first signal line QL and corresponding to the overlapping region R2 is larger than a second gap DS2 located between the second signal line C1 and the first signal line QL and far from the overlapping region R2. That is to say, the first gap DS1 located between the second signal line C1 and the first signal line QL and corresponding to the overlapping region R2 is larger than the second gap DS2 located between the second signal line C1 and the first transition portion T1/the second transition portion T2 of the first signal line QL. With the design of the first transition portion T1 and the second transition portion T2, the first signal line QL and the second signal line C1 may be spaced from each other by a large distance for arranging the first part BF1 and the second part BF2 of the buffer layer BF, and the connection or contact of the first part BF1 and the second part BF2 of the buffer layer BF may be avoided.

Although only the first signal line QL has the transition portions in this embodiment, the invention is not limited thereto. In other embodiments, the second signal line C1 and/or the third signal line (not depicted) may also have a transition portion corresponding to the overlapping region.

In this embodiment, a first output signal overlapping region R3 exists between the output signal line GL and the conductive wires L1 to L4, and the buffer layer BF is not disposed in the first output signal overlapping region R3 (e.g., a first gate signal overlapping region).

Although the output signal line GL does not overlap the first signal line QL and the second signal line C1 in this embodiment, the invention is not limited thereto. The parts of the buffer layer BF correspond to the first signal line QL, the second signal line C1, and the third signal line are separated from one another. In other words, the first signal line QL, the second signal line C1, and the third signal line (not depicted) are not electrically connected to one another through the buffer layer BF.

The driving circuit in this embodiment includes an output circuit 10, a pull-down module PM, the conductive wires L1 to L4, the first signal line QL, and the buffer layer BF. The conductive wires L1 to L4 are, for example, electrically connected between the output circuit 10 and the pull-down module PM. The first signal line QL is configured to couple the output circuit 10 and the pull-down module PM to a driving control signal Q(n). Here, the overlapping region R1 exists between the first signal line QL and the conductive wires L1 to L4. The buffer layer BF is disposed between the first signal line QL and the conductive wires L1 to L4. The buffer layer BF includes the overlapping portion OR and the extending portion ER. The overlapping portion OR is at least located in the overlapping region R1. The extending portion ER is located outside of the overlapping portion OR. A thickness of the overlapping portion OR is greater than a thickness of the extending portion ER.

Based on the above, in the driving circuit of the invention, the buffer layer BF is disposed between the first signal line QL and the conductive wires L1 to L4 and between the second signal line C1 and the conductive wires L1 to L4. Thereby, signal malfunctions caused by the leakage of current of the first signal line QL and the second signal line C1 in the driving circuit are corrected.

Figure 4:
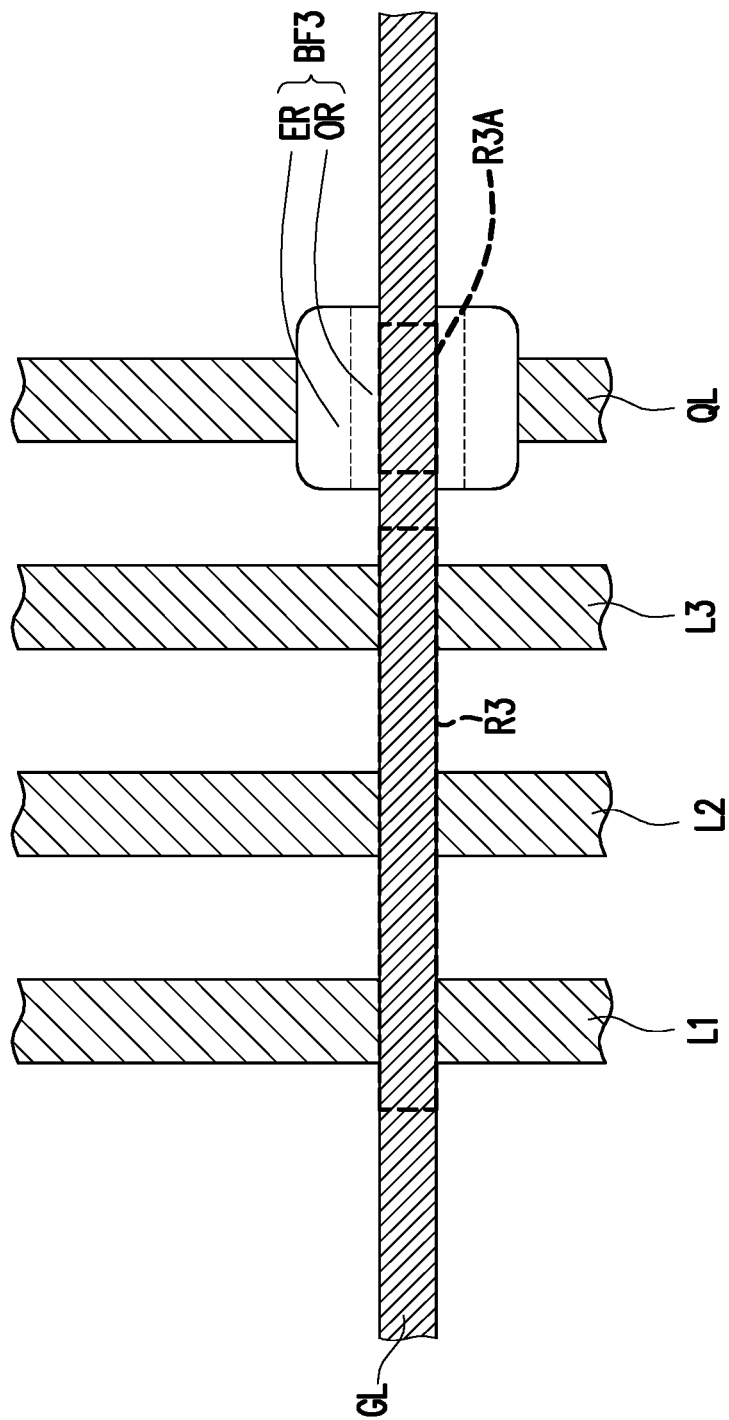
FIG. 4 is a schematic diagram of a portion of circuit layout of a driving circuit in an embodiment of the invention.

FIG. 4 is a schematic diagram of another portion of a circuit layout of the driving circuit of FIG. 2 in another embodiment of the invention. The reference numerals and some descriptions in the embodiment shown in FIG. 3A and FIG. 3B are continuously applied in the embodiment depicted in FIG. 4, wherein identical or similar numerals are used to refer to identical or similar components, and descriptions on the same technical content are omitted. The omitted descriptions may be derived from the above embodiments and will not be repeated in the following embodiment.

Major differences between the embodiment depicted in FIG. 4 and the embodiment depicted in FIG. 3A lie in that a first output signal overlapping region R3 exists between an output signal line GL and the conductive wires L1 to L4, the buffer layer BF is not disposed in the first output signal overlapping region R3 (such as a first gate signal overlapping region), and a second output signal overlapping region R3A exists between the output signal line GL and the first signal line QL according to the embodiment depicted in FIG. 4.

In this embodiment, a third part BF3 of the buffer layer BF is further disposed in the second output signal overlapping region R3A (such as a second gate signal overlapping region). In some embodiments, an overlapping region exists between the output signal line GL and a second signal line or a third signal line. The buffer layer BF is disposed in the overlapping region between the output signal line GL and the second signal line or the third signal line.

Based on the above, in the driving circuit of the invention, the buffer layer BF is disposed between the output signal line GL and the first signal line QL. Thereby, signal malfunctions caused by the leakage of current of the output signal line GL and the first signal line QL in the driving circuit are corrected.

Figure 5:
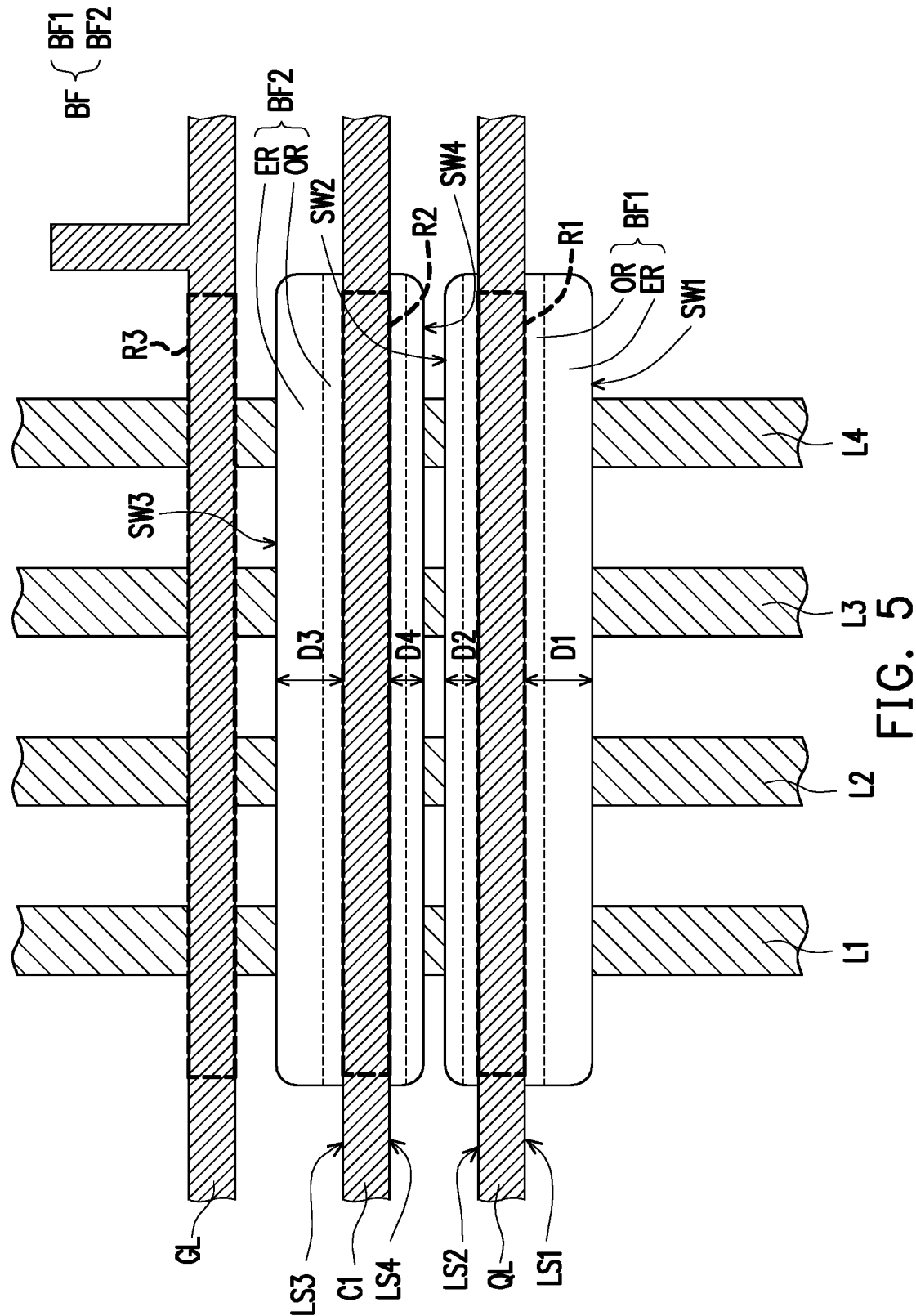
FIG. 5 is schematic diagram of a portion of circuit layout of a driving circuit in an embodiment of the invention.

FIG. 5 is a schematic diagram of another portion of a circuit layout of the driving circuit in FIG. 2. The reference numerals and some descriptions in the embodiment of FIG. 3A and FIG. 3B are continuously applied in an embodiment of FIG. 5, wherein identical or similar numerals are used to refer to identical or similar components, and descriptions on the same technical content are omitted. The omitted descriptions may be derived from the above embodiments and will not be repeated in the following embodiment.

A major difference between the embodiment shown in FIG. 5 and the embodiment depicted in FIG. 3A lies in that a first signal line QL provided in the embodiment of FIG. 5 does not have any transition portion that is located corresponding to an overlapping region R2.

In this embodiment, an overlapping region R1 exists between the first signal line QL and conductive wires L1 to L4. A first part BF of a buffer layer BF is disposed between the first signal line QL and the conductive wires L1 to L4.

In an embodiment, the first signal line QL has a first long side LS1 and a second long side LS2. A first part BF1 of a buffer layer BF has a first edge SW1 and a second edge SW2. The first edge SW1 extends along an extending direction of the first long side LS1. A first distance D1 is between the first edge SW1 and the first long side LS1 on an orthogonal projection surface. The orthogonal projection surface is, for example, a surface of a substrate BS facing the first signal line QL. The second edge SW2 extends along an extending direction of the second long side LS2. A second distance D2 is between the second edge SW2 and the second long side LS2 on an orthogonal projection surface. In this embodiment, D1>D2. According to the embodiment, the first edge SW1 is parallel to the first long side LS1, and the second edge SW2 is parallel to the second long side LS2.

The overlapping region R2 exists between the second signal line C1 and the conductive wires L1 to L4. A second part BF2 of the buffer layer BF is further disposed between the second signal line C1 and the conductive wires L1 to L4 and is at least located in the overlapping region R2. In some preferred embodiments, the second part BF2 of the buffer layer BF exceeds the overlapping region R2 of the second signal line C1 and the conductive wires L1 to L4 on an orthogonal projection surface.

In an embodiment, the second signal line C1 has a first long side LS3 and a second long side LS4. The second part BF2 of the buffer layer BF has a first edge SW3 and a second edge SW4. The first edge SW3 extends along an extending direction of the first long side LS3. A first distance D3 is between the first edge SW3 and the first long side LS3 on an orthogonal projection surface. The orthogonal projection surface is, for example, a surface of the substrate BS facing the second signal line C1. The second edge SW3 extends along an extending direction of the second long side LS3. A second distance D4 is between the second edge SW4 and the second long side LS4 on an orthogonal projection surface. In this embodiment, D3>D4. According to the embodiment, the first edge SW3 is parallel to the first long side LS3, and the second edge SW4 is parallel to the second long side LS4.

In this embodiment, the second edge SW2 of the first part BF1 of the buffer layer BF is adjacent to the second edge SW4 of the second part BF2 of the buffer layer BF. Since D1>D2 and D3>D4, the gap between the first part BF1 of the buffer layer BF and the second part BF2 of the buffer layer BF is sufficient, so as to prevent the contact of the first part BF1 of the buffer layer BF and the second part BF2 of the buffer layer BF.

Based on the above, in the driving circuit of the invention, the buffer layer BF is disposed between the first signal line QL and the conductive wires L1 to L4 and between the second signal line C1 and the conductive wires L1 to L4. Thereby, signal malfunctions caused by the leakage of current of the first signal line QL and the second signal line C1 in the driving circuit are corrected.

Figure 6:
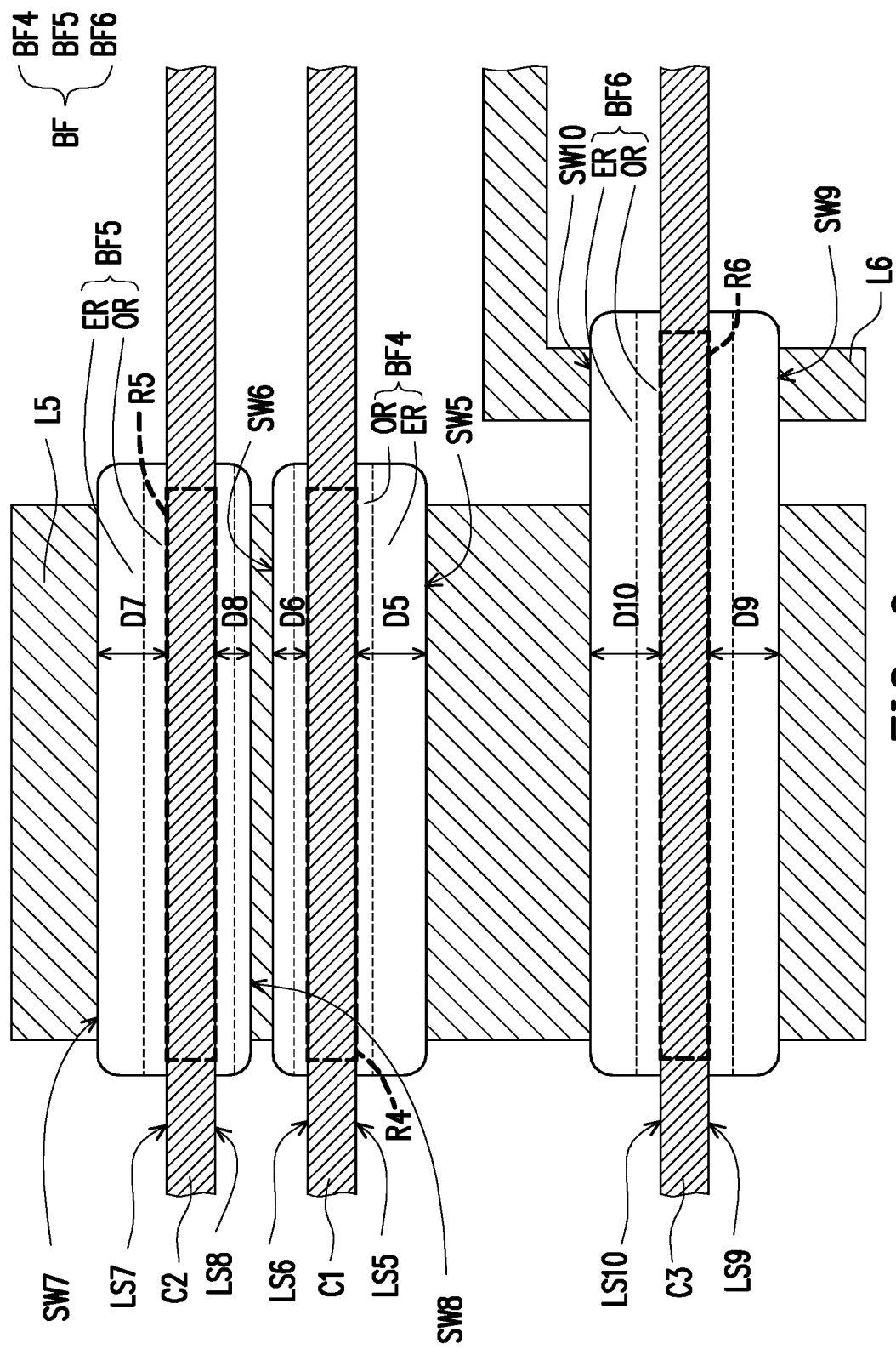
FIG. 6 is a schematic diagram of a portion of circuit layout of a driving circuit in an embodiment of the invention.

FIG. 6 is a schematic diagram of another portion of a circuit layout of the driving circuit of FIG. 2. The reference numerals and some descriptions in the embodiment of FIG. 3A and FIG. 3B are continuously applied in an embodiment of FIG. 6, wherein identical or similar numerals are used to refer to identical or similar components, and descriptions on the same technical content are omitted. The omitted descriptions may be derived from the above embodiments and will not be repeated in the following embodiment.

In this embodiment, a driving circuit includes a conductive wire L5, a conductive wire L6, a second signal line C1, a third signal line C2, and a third signal line C3. The conductive wires L5 and L6 belong to the metal layer(s) different from the metal layer(s) of the second signal line C1, the third signal line C2, and the third signal line C3. The conductive wire L5 and the conductive wire L6 provided in this embodiment and the conductive lines L1 to L4 depicted in FIG. 3A belong to one film layer, for instance, and the second signal line C1, the third signal line C2, and the third signal line C3 all belong to another film layer, for instance. An insulation layer and a buffer layer BF, for example, are interposed between the conductive wire L5 and the second signal line C1, the third signal line C2, and the third signal line C3. An insulation layer and a buffer layer BF, for example, are interposed between the conductive wire L6 and the third signal line C3. In an embodiment, the second signal line C1 is, for example, configured to transmit a clock signal (such as a clock signal HC). In an embodiment, the third signal line C2 is, for example, configured to transmit a clock signal (such as a clock signal LC1). In an embodiment, the third signal line C3 is, for example, configured to transmit a clock signal (such as clock signal LC2).

An overlapping region R4 exists between the second signal line C1 and the conductive wire L5. A fourth part BF4 of the buffer layer BF is further disposed between the second signal line C1 and the conductive wire L5 and is at least located in the overlapping region R4. In some preferred embodiments, the fourth part BF4 of the buffer layer BF exceeds the overlapping region R4 of the second signal line C1 and the conductive wire L5 on an orthogonal projection surface.

In an embodiment, the second signal line C1 has a first long side LS5 and a second long side LS6. The fourth part BF4 of the buffer layer BF has a first edge SW5 and a second edge SW6. The first edge SW5 extends along an extending direction of the first long side LS5. A first distance D5 is between the first edge SW5 and the first long side LS5 on an orthogonal projection surface. The orthogonal projection surface is, for example, a surface of a substrate BS facing the second signal line C1. The second edge SW6 extends along an extending direction of the second long side LS6. A second distance D6 is between the second edge SW6 and the second long side LS6 on an orthogonal projection surface. In this embodiment, D5>D6, but the invention is not limited thereto. In another embodiment, D5=D6. According to the embodiment, the first edge SW5 is parallel to the first long side LS5, and the second edge SW6 is parallel to the second long side LS6.

In an embodiment, the fourth part BF4 of the buffer layer BF overlaps the second signal line C1 in a manner similar to the manner in which the first part BF1 of the buffer layer BF overlaps the first signal line QL. Nevertheless, the invention is not limited thereto. In other embodiments, the fourth part BF4 of the buffer layer BF overlaps the second signal line C1 in a manner different from the manner in which the first part BF1 of the buffer layer BF overlaps the first signal line QL.

An overlapping region R5 exists between the third signal line C2 and the conductive wire L5. A fifth part BF5 of the buffer layer BF is further disposed between the third signal line C2 and the conductive wire L5 and is at least located in the overlapping region R5. In some preferred embodiments, the fifth part BF5 of the buffer layer BF exceeds the overlapping region R5 of the third signal line C2 and the conductive wire L5 on an orthogonal projection surface.

In an embodiment, the third signal line C2 has a first long side LS7 and a second long side LS8. The fifth part BF5 of the buffer layer BF has a first edge SW7 and a second edge SW8. The first edge SW7 extends along an extending direction of the first long side LS7. A first distance D7 is between the first edge SW7 and the first long side LS7 on an orthogonal projection surface. The orthogonal projection surface is, for example, a surface of a substrate BS facing the third signal line C2. The second edge SW8 extends along an extending direction of the second long side LS8. A second distance D8 is between the second edge SW8 and the second long side LS8 on an orthogonal projection surface. In this embodiment, D7>D8, but the invention is not limited thereto. In another embodiment, D7=D8. According to the embodiment, the first edge SW7 is parallel to the first long side LS7, and the second edge SW8 is parallel to the second long side LS8.

In an embodiment, the fifth part BF5 of the buffer layer BF overlaps the third signal line C2 in a manner similar to the manner in which the first part BF1 of the buffer layer BF overlaps the first signal line QL. Nevertheless, the invention is not limited thereto. In other embodiments, the fifth part BF5 of the buffer layer BF overlaps the third signal line C2 in a manner different from the manner in which the first part BF1 of the buffer layer BF overlaps the first signal line QL.

An overlapping region R6 exists between the third signal line C3 and the conductive wires L5 and L6. A sixth part BF6 of the buffer layer BF is further disposed between the third signal line C3 and the conductive wires L5 and L6 and is at least located in the overlapping region R6. In some preferred embodiments, the sixth part BF6 of the buffer layer BF exceeds the overlapping regions R6 of the third signal line C3 and the conductive wires L5 and L6 on an orthogonal projection surface.

In an embodiment, the third signal line C3 has a first long side LS9 and a second long side LS10. The sixth part BF6 of the buffer layer BF has a first edge SW9 and a second edge SW10. The first edge SW9 extends along an extending direction of the first long side LS9. A first distance D9 is between the first edge SW9 and the first long side LS9 on an orthogonal projection surface. The orthogonal projection surface is, for example, a surface of a substrate BS facing the third signal line C3. The second edge SW10 extends along an extending direction of the second long side LS10. A second distance D10 is between the second edge SW10 and the second long side LS10 on an orthogonal projection surface. In this embodiment, D9=D10, but the invention is not limited thereto. In another embodiment, D9>D10. According to the embodiment, the first edge SW9 is parallel to the first long side LS9, and the second edge SW10 is parallel to the second long side LS10.

In an embodiment, the sixth part BF6 of the buffer layer BF overlaps the third signal line C3 in a manner similar to that the manner in which the first part BF1 of the buffer layer BF overlaps the first signal line QL. Nevertheless, the invention is not limited thereto. In other embodiments, the sixth part BF6 of the buffer layer BF overlaps the third signal line C3 in the manner different from the manner in which the first part BF1 of the buffer layer BF overlaps the first signal line QL.

Based on the above, in the driving circuit of the invention, the buffer layer BF is disposed between the second signal line C1 and the conductive wire L5, between the third signal line C2 and the conductive wire L5, and between the third signal line C3 and the conductive wires L5 and L6. Thereby, signal malfunctions caused by the leakage of current of the second signal line C1 and the third signal lines C2 and C3 in the driving circuit are corrected.

FIG. 7 is a schematic cross-sectional view of a portion of a circuit of a known driving circuit. FIG. 8 is a schematic cross-sectional view of a portion of a circuit of a driving circuit in an embodiment of the invention. FIG. 9 is a schematic cross-sectional view of a portion of a circuit of a driving circuit in another embodiment of the invention. FIG. 10 is a schematic cross-sectional view of a portion of a circuit of a driving circuit in yet another embodiment of the invention.

As shown in FIG. 7 to FIG. 10, a conductive wire 100 is disposed on a substrate BS. A signal line 200 is disposed on the conductive wire 100. An insulation layer 110 is interposed between the signal line 200 and the conductive wire 100. The signal line 200 is, for example, similar to the first signal line, the second signal line, or the third signal line in the previous embodiments. In an embodiment, the signal line 200 includes, for example, a top layer 204 and a bottom layer 202. The bottom layer 202 contacts the insulation layer 110. Insulation layers 210a to 210d cover the signal line 200 and include first stress regions 212a to 212d and a second stress region 214. Stresses of the first stress regions 212a to 212d are greater than a stress of the second stress region 214.

In the comparative example (related art) of FIG. 7, no buffer layer is disposed between the signal line 200 and the insulation layer 110. However, in the embodiments depicted in FIG. 8 to FIG. 10, a buffer layer 120 is disposed between the signal line 200 and the insulation layer 110. The buffer layer 120 includes an overlapping portion 122 and an extending portion 124. The overlapping portion 122 includes a doped portion 122A and an amorphous portion 122B. In the embodiments depicted in FIG. 8 and FIG. 9, the overlapping portion 122 exceeds a side of the signal line 200 on an orthogonal projection surface (e.g., a surface of the substrate BS facing the signal line 200). A width of the overlapping portion 122 exceeding the side of the signal line 200 is greater in the embodiment depicted in FIG. 8 than in the embodiment depicted in FIG. 9. In this embodiment, W1/W2 of the overlapping portion 122 of FIG. 8 is approximately 0.3, while W1/W2 of the overlapping portion 122 of FIG. 9 is approximately 0.1. In the embodiment depicted in FIG. 10, the overlapping portion 122 is aligned to a side surface of the signal line 200. In other words, in the embodiment depicted in FIG. 10, the overlapping portion 122 does not exceed a side of the signal line 200.

Widths of the first stress regions 212b to 212d bordering with the signal line 200 (a common border of the buffer layer 120, the signal line 200, and the insulation layer 210) when the buffer layer 120 is disposed between the signal line 200 and the insulation layer 110 (FIG. 8 to FIG. 10) are greater than the widths of the first stress regions 212a bordering with the signal line 200 (the common border of the buffer layer 120, the signal line 200, and the insulation layer 210) when no buffer layer 120 is disposed between the signal line 200 and the insulation layer 110 (FIG. 7). In other words, the first stress regions 212b to 212d are separated when the buffer layer 120 is disposed. Moreover, the stresses of the first stress regions 212b to 212d (FIG. 8 to FIG. 10) are less than the stress of the first stress region 212a (FIG. 7). Therefore, voids are less likely to be formed due to the concentration of stress on the insulation layers 210b to 210d in the subsequent manufacturing process.

Moreover, according to FIG. 8 to FIG. 10, a width of the first stress region 212b in FIG. 8, where the width of the overlapping portion 122 exceeding one side of the signal line 200, is larger than a width of the first stress region 212c in FIG. 9, and the width of the first stress region 212c is larger than a width of the first stress region 212d. Hence, the stress on the insulation layer 210c may be better dispersed according to the embodiment depicted in FIG. 9, where the overlapping portion 122 exceeds the signal line 200. As such, voids resulting from the concentration of stress are less likely to be formed in the insulation layer 210c in the subsequent manufacturing process. The stress on the insulation layer 210b may even be better dispersed according to the embodiment depicted FIG. 8, such that voids resulting from the concentration of stress are even less likely to be formed in the insulation layer 210b in the subsequent manufacturing process.

Figure 11A:
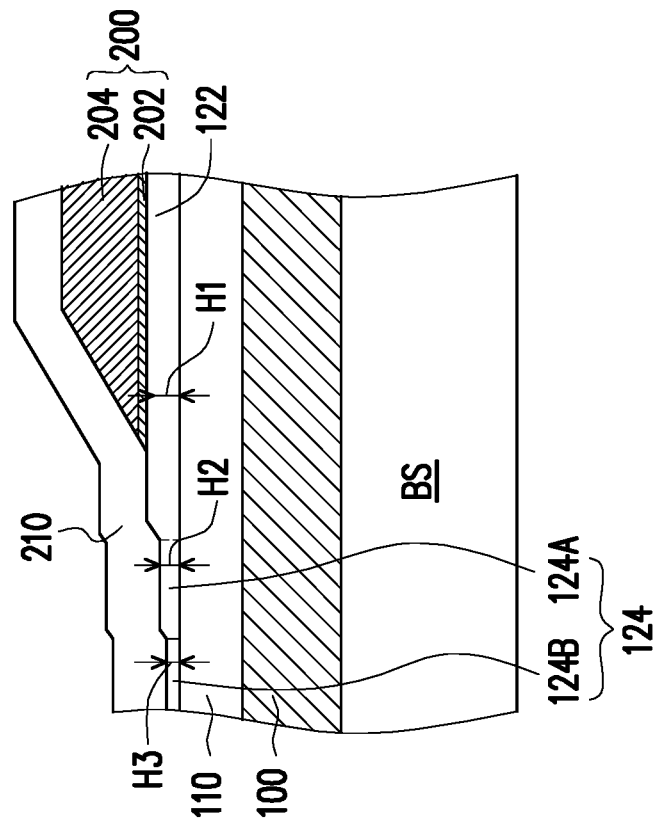
FIG. 11A is a schematic cross-sectional view of a portion of circuit layout of a driving circuit in an embodiment of the invention.

FIG. 11A is a schematic cross-sectional view of a portion of a circuit of a driving circuit in an embodiment of the invention. It should be noted that the reference numerals and some descriptions in the embodiment of FIG. 8 are continuously applied in an embodiment of FIG. 11A, wherein identical or similar numerals are used to refer to identical or similar components, and descriptions on the same technical content are omitted. The omitted descriptions may be derived from the above embodiments and will not be repeated in the following embodiment.

A difference between the embodiment depicted in FIG. 11A and the embodiment depicted in FIG. 8 lies in that an extending portion 124 of a buffer layer 120 shown in FIG. 11A includes an extending edge portion 124B and an extending connection portion 124A.

In this embodiment, the extending connection portion 124A is located between the extending edge portion 124B and an overlapping portion 122.

In an embodiment, an etching process (such as a plasma etching process), for example, is performed after a signal line 200 is forming but before an insulation layer 210 is formed. The etching process is performed with use of the signal line 200 as a mask. Due to the difference in etching rates, the thickness of the buffer layer 120 close to the signal line 200 (i.e., with the lower etching rate) is greater than the thickness of the buffer layer 120 away from the signal line 200 (i.e., with the higher etching rate). In an embodiment, a thickness of the overlapping portion 122 is H1, a thickness of the extending connection portion 124A is H2, a thickness of the extending edge portion 124B is H3, and H1>H2>H3.

Based on the above, the buffer layer is disposed between the signal line 200 and the insulation layer 110 according to this embodiment. Hence, the stress on the insulation layer 210 may be dispersed, such that voids resulting from the concentration of stress are less likely to be formed in the insulation layer 210 in the subsequent manufacturing process.

Figure 11B:
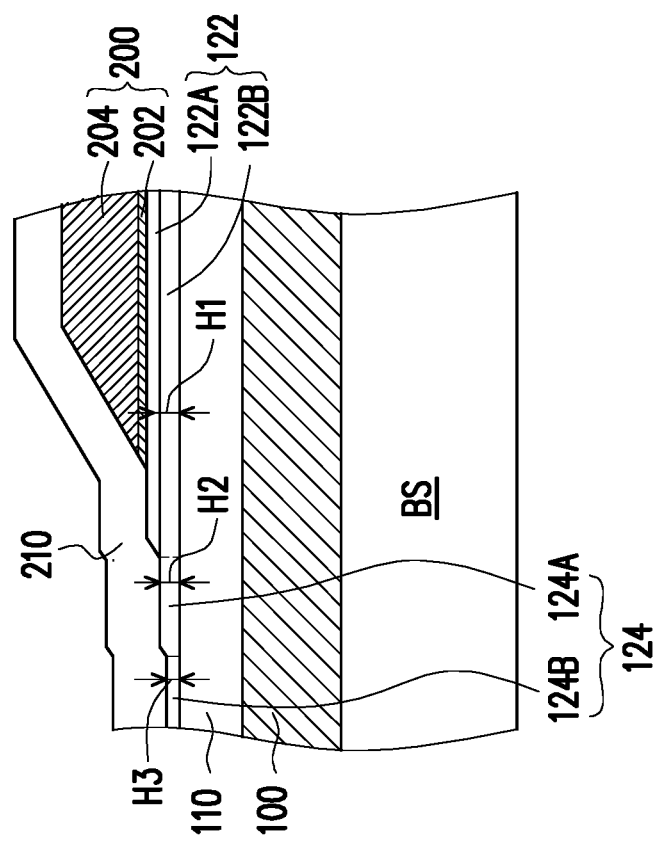
FIG. 11B is a schematic cross-sectional view of a portion of circuit layout of a driving circuit in an embodiment of the invention.

FIG. 11B is a schematic cross-sectional view of a portion of a circuit of a driving circuit in an embodiment of the invention. It should be noted that the reference numerals and some descriptions in the embodiment of FIG. 11A are continuously applied in an embodiment of FIG. 11B, wherein identical or similar numerals are used to refer to identical or similar components, and descriptions on the same technical content are omitted. The omitted descriptions may be derived from the above embodiments and will not be repeated in the following embodiment.

A difference between the embodiment depicted in FIG. 11B and the embodiment depicted in FIG. 11A lies in that an overlapping portion 122 of a buffer layer 120 in FIG. 11B does not include a doped portion 122A.

In this embodiment, the buffer layer 120 has, for example, a single-layered structure. A thickness of the overlapping portion 122 is H1, a thickness of an extending connection portion 124A is H2, a thickness of an extending edge portion 124B is H3, and H1>H2>H3.

Based on the above, the buffer layer is disposed between the signal line 200 and the insulation layer 110 in this embodiment. Hence, the stress on the insulation layer 210 may be dispersed, such that voids resulting from the concentration of stress are less likely to be formed in the insulation layer 210 in the subsequent manufacturing process.

To sum up, in the driving circuit of the invention, the buffer layer is disposed between the signal lines and the conductive wires. Thereby, signal malfunctions caused by the leakage of current of the signal lines and the conductive lines in the driving circuit are corrected. In an embodiment, the signal lines are configured to transmit the clock signal or the driving control signal. In an embodiment of the invention, the buffer layer includes the overlapping portion and the extending portion, wherein the thickness of the overlapping portion is greater than the thickness of the extending portion. The overlapping portion exceeds one side of the signal lines on an orthogonal projection surface. Thereby, the stress on the insulation layer located on the signal lines is dispersed, such that voids resulting from the concentration of stress are less likely to be formed in the insulation layer in the subsequent manufacturing process.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A driving circuit, comprising:
an output circuit and a pull-down module;
a plurality of conductive wires electrically connected between the output circuit and the pull-down module;
at least one first signal line configured to couple the output circuit and the pull-down module to a driving control signal, wherein a first overlapping region exists between the at least one first signal line and a portion of the conductive wires; and
a buffer layer disposed between the at least one first signal line and a portion of the conductive wires, wherein the buffer layer comprises an overlapping portion and an extending portion, the overlapping portion is at least located in the first overlapping region, the extending portion is located outside the overlapping portion, and a thickness of the overlapping portion is greater than a thickness of the extending portion,
wherein the at least one first signal line has a first long side and a second long side, the buffer layer has a first edge and a second edge, the first edge extends along an extending direction of the first long side, a first distance D1 is between the first edge and the first long side on an orthogonal projection surface, the second edge extends along an extending direction of the second long side, a second distance D2 is between the second edge and the second long side on the orthogonal projection surface, and D1=D2 or D1>D2,
wherein the overlapping portion has a first border and a second border, the first border is located between the first edge and the first long side on the orthogonal projection surface, the second border is located between the second edge and the second long side on the orthogonal projection surface, a first width W1 is between the first border and the first long side on the orthogonal projection surface, and a second width W2 is between the first edge and the first long side on the orthogonal projection surface, wherein W1/W2 falls in a range from 0.05 to 0.5.

2. The driving circuit of claim 1, wherein the output circuit comprises a thin film transistor, the thin film transistor comprises a gate, a source, and a drain, the gate is electrically connected to the at least one first signal line, and the drain is electrically connected to an output signal line.

3. The driving circuit of claim 2, wherein a first output signal overlapping region exists between the output signal line and a portion of the conductive wires, and the buffer layer is not disposed in the first output signal overlapping region.

4. The driving circuit of claim 2, wherein a second output signal overlapping region exists between the output signal line and the at least one first signal line, and the buffer layer is disposed in the second output signal overlapping region.

5. The driving circuit of claim 1, wherein the conductive wires and the at least one first signal line belong to different metal layers.

6. The driving circuit of claim 1, wherein the buffer layer comprises silicon or an insulating material.

7. The driving circuit of claim 1, further comprising a second signal line configured to transmit a clock signal to the output circuit, wherein a second overlapping regions exists between the second signal line and a portion of the conductive wires, and the buffer layer is further disposed between the second signal line and a portion of the conductive wires and is at least located in the second overlapping region.

8. The driving circuit of claim 7, wherein the at least one first signal line is located adjacent to the second signal line, a first gap exists between the at least one first signal line and the second signal line corresponding to the second overlapping region, a second gap exists between the at least one first signal line and the second signal line away from the second overlapping region, and the first gap is larger than the second gap.

9. The driving circuit of claim 1, further comprising at least one third signal line configured to transmit a second clock signal to the pull-down module, wherein a third overlapping region exists between the at least one third signal line and a portion of the conductive wires, and the buffer layer is further located between the at least one third signal line and a portion of the conductive wires and is at least located in the third overlapping region.

10. A driving circuit, comprising:
an output circuit and a pull-down module;
a plurality of conductive wires electrically connected between the output circuit and the pull-down module;
at least one first signal line configured to couple the output circuit and the pull-down module to a driving control signal, wherein a first overlapping region exists between the at least one first signal line and a portion of the conductive wires; and
a buffer layer disposed between the at least one first signal line and a portion of the conductive wires, wherein the buffer layer comprises an overlapping portion and an extending portion, the overlapping portion is at least located in the first overlapping region, the extending portion is located outside the overlapping portion, and a thickness of the overlapping portion is greater than a thickness of the extending portion, wherein the extending portion comprises an extending edge portion and an extending connection portion, the extending connection portion is located between the extending edge portion and the overlapping portion, and a thickness of the extending connection portion is greater than a thickness of the extending edge portion.

11. A display panel comprising a pixel region and a driving circuit region located on at least one side of the pixel region, the display panel comprising:
a pixel array located in the pixel region, the pixel array comprising a plurality of data lines, a plurality of scan lines, and a plurality of pixel structures electrically connected to the scan lines and the data lines;
a gate driving circuit located in the driving circuit region and electrically connected to the pixel array, wherein the gate driving circuit comprises:
an output circuit and a pull-down module, wherein an end of the output circuit is electrically connected to the pixel array;
a plurality of conductive wires connected between the output circuit and the pull-down module;
at least one first signal line configured to couple the output circuit and the pull-down module to a driving control signal, wherein a first overlapping region exists between the at least one first signal line and a portion of the conductive wires, and the at least one first signal line has a first long side and a second long side; and
a buffer layer disposed between the at least one first signal line and a portion of the conductive wires, wherein the buffer layer comprises an overlapping portion and an extending portion, the overlapping portion is at least located in the first overlapping region, the extending portion is located outside the overlapping portion, and a thickness of the overlapping portion is greater than a thickness of the extending portion, wherein the buffer layer has a first edge and a second edge, the overlapping portion has a first border and a second border, the first border is located between the first edge and the first long side on the orthogonal projection surface, and the second border is located between the second edge and the second long side on the orthogonal projection surface.

12. The display panel of claim 11, wherein the output circuit comprises a thin film transistor, the thin film transistor comprises a gate, a source, and a drain, the gate is electrically connected to the at least one first signal line, and the drain is electrically connected to a gate signal line.

13. The display panel of claim 12, wherein the output circuit transmits a driving signal to the gate signal line according to the driving control signal.

14. The display panel of claim 12, wherein
the gate signal line is electrically connected to one of the scan lines, a first gate signal overlapping region exists between the gate signal line and a portion of the conductive wires, the buffer layer is not disposed in the first gate signal overlapping region,
a second gate signal overlapping region exists between the gate signal line and the at least one first signal line, and the buffer layer is further disposed in the second gate signal overlapping region.

15. The display panel of claim 11, wherein
the first edge extends along an extending direction of the first long side, a first distance D1 is between the first edge and the first long side on the orthogonal projection surface, the second edge extends along an extending direction of the second long side, a second distance D2 is between the second edge and the second long side on the orthogonal projection surface, and
D1=D2 or D1>D2.

16. The display panel of claim 15, wherein
a first width W1 is between the first border and the first long side on the orthogonal projection surface, and a second width W2 is between the first edge and the first long side on the orthogonal projection surface, wherein W1/W2 is in a range from 0.05 to 0.5.

17. The display panel of claim 11, wherein the extending portion comprises an extending edge portion and an extending connection portion, the extending connection portion is located between the extending edge portion and the overlapping portion, and a thickness of the extending connection portion is greater than a thickness of the extending edge portion.

18. The display panel of claim 11, wherein the buffer layer comprises silicon or an insulating material.

19. The display panel of claim 11, further comprising at least one second signal line configured to transmit a first clock signal to the output circuit, wherein a second overlapping region exists between the at least one second signal line and a portion of the conductive wires, and the buffer layer is further disposed between the at least one second signal line and a portion of the conductive wires and is at least located in the second overlapping region.

20. The display panel of claim 19, wherein
the at least one first signal line is located adjacent to the at least one second signal line, a first gap exists between the at least one first signal line and the at least one second signal line corresponding to the second overlapping region, a second gap exists between the at least one first signal line and the second signal line away from the second overlapping region, and the first gap is larger than the second gap.

21. The display panel of claim 11, further comprising at least one third signal line configured to transmit a second clock signal to a voltage-stabilizing control circuit of the pull-down module, wherein a third overlapping region exists between the at least one third signal line and a portion of the conductive wires, and the buffer layer is further disposed between the at least one third signal line and a portion of the conductive wires and is at least located in the third overlapping region.

* * * * *